(12) United States Patent
Ji et al.

(10) Patent No.: US 6,439,901 B1
(45) Date of Patent: Aug. 27, 2002

(54) ELECTRICAL CONNECTOR WITH RELEASABLE PICK-UP DEVICE

(75) Inventors: Zhang Jiang Ji; Wei Ya Cheng, both of Kunsan (CN)

(73) Assignee: Hon Hai Precoision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/976,932

(22) Filed: Oct. 11, 2001

(51) Int. Cl.[7] .............................................. H01R 13/44
(52) U.S. Cl. ...................................... 439/135; 439/940
(58) Field of Search .............................. 439/135, 149, 439/940, 476.1, 477, 478, 607

(56) References Cited

U.S. PATENT DOCUMENTS 5,249,977 A * 10/1993 Tanaka et al. ............... 439/135
5,688,133 A * 11/1997 Ikesugi et al. ............... 439/135
6,015,305 A * 1/2000 McHugh et al. ............. 439/135
6,135,795 A * 10/2000 Ho et al. ..................... 439/135

* cited by examiner

Primary Examiner—Hien Vu
(74) Attorney, Agent, or Firm—Wei Te Chung

(57) ABSTRACT

A releasable pick-up device (30) for assisting in positioning an electrical connector (1) on a circuit board by a vacuum-suction nozzle, comprises a rectangular plate (31) having a flat upper surface (311) to be manipulated by the nozzle and an opposite lower surface (312), and a pair of retaining portions (32) extending from opposite transverse sides of the plate. Each retaining portion forms a pair of downwardly projecting legs (320) having a pair of respective retaining feet (321) formed at free ends thereof and protruding in directions opposite to each other.

6 Claims, 3 Drawing Sheets

ELECTRICAL CONNECTOR WITH RELEASABLE PICK-UP DEVICE

BACKGROUND OF THE INVENTION

1. Field of the Invention

The present invention relates to an electrical connector to be placed on a surface of a circuit board by a conventional, vacuum-suction tool, and particularly to a surface mount electrical connector with a releasable pick-up device.

2. Description of Related Art

In order to answer for the requirement of automatic operation, the use of vacuum-suction tools to pick up and place electrical connectors or other electrical articles on circuit boards is well known in the art. The related art, referring to U.S. Pat. No. 5,249,977, discloses a conventional plug connector having a cap member releasably attached thereto for carrying to a circuit board by a vacuum-suction tool so as to implement soldering procedure. The conventional plug connector has an elongate mating cavity opening to a mating face and a mating rib projecting, centrally of the mating cavity, from a base wall of the connector. The mating rib defines a plurality of passageways in opposite sides thereof for receiving corresponding conductive contacts, wherein top ends of the contacts are exposed to the mating cavity. The cap member forms two legs depending from a lower surface thereof and defining a receiving space therebetween to engage with the mating rib. However, when the cap member is press-fitted into or is pulled out from the mating cavity of the connector, the conductive contacts would scratch inner surfaces of the legs of the cap member.

Hence, it is desirable to provide an electrical connector with an improved pick-up device to overcome the above-mentioned disadvantages.

SUMMARY OF THE INVENTION

Accordingly, one object of the present invention is to provide an electrical connector with an improved releasable pick-up device.

Another object of the present invention is to provide an electrical connector with a releasable pick-up device to precisely position the electrical connector on a circuit board.

In order to achieve the above-mentioned objects, an electrical connector with a releasable pick-up device for carrying to a circuit board by a vacuum-suction tool comprises an insulating housing having an elongated base wall and side walls extending from the base wall with a mating cavity defined therebetween. A mating rib projects from the base wall and extends along a lengthwise direction. A plurality of passageways are defined in opposite sides of the mating rib for receiving a plurality of conductive pins. The releasable pick-up device includes a rectangular plate which has a flat upper surface for being suctioned by the vacuum-suction tool and an opposite lower surface, and a pair of retaining portions extending from opposite transverse sides of the plate. Each retaining portion forms a pair of legs each forming a retaining foot at a free end thereof. The retaining feet of the same pair of legs protrude oppositely to each other. The rectangular plate also defines a longitudinal exposed depressed area in the lower surface thereof, and forms an inclined first face between the depressed area and the lower surface. The plate further defines an inclined second face on a longitudinal side thereof opposite to the first face. The first face and the second face respectively engage with a topside of a longitudinal side wall of the connector and a topside of a shielding plate covering an opposite longitudinal side wall to ensure a precise positioning of the connector.

Other objects, advantages and novel features of the invention will become more apparent from the following detailed description when taken in conjunction with the accompanying drawings.

DETAILED DESCRIPTION OF THE INVENTION

Figure 1:
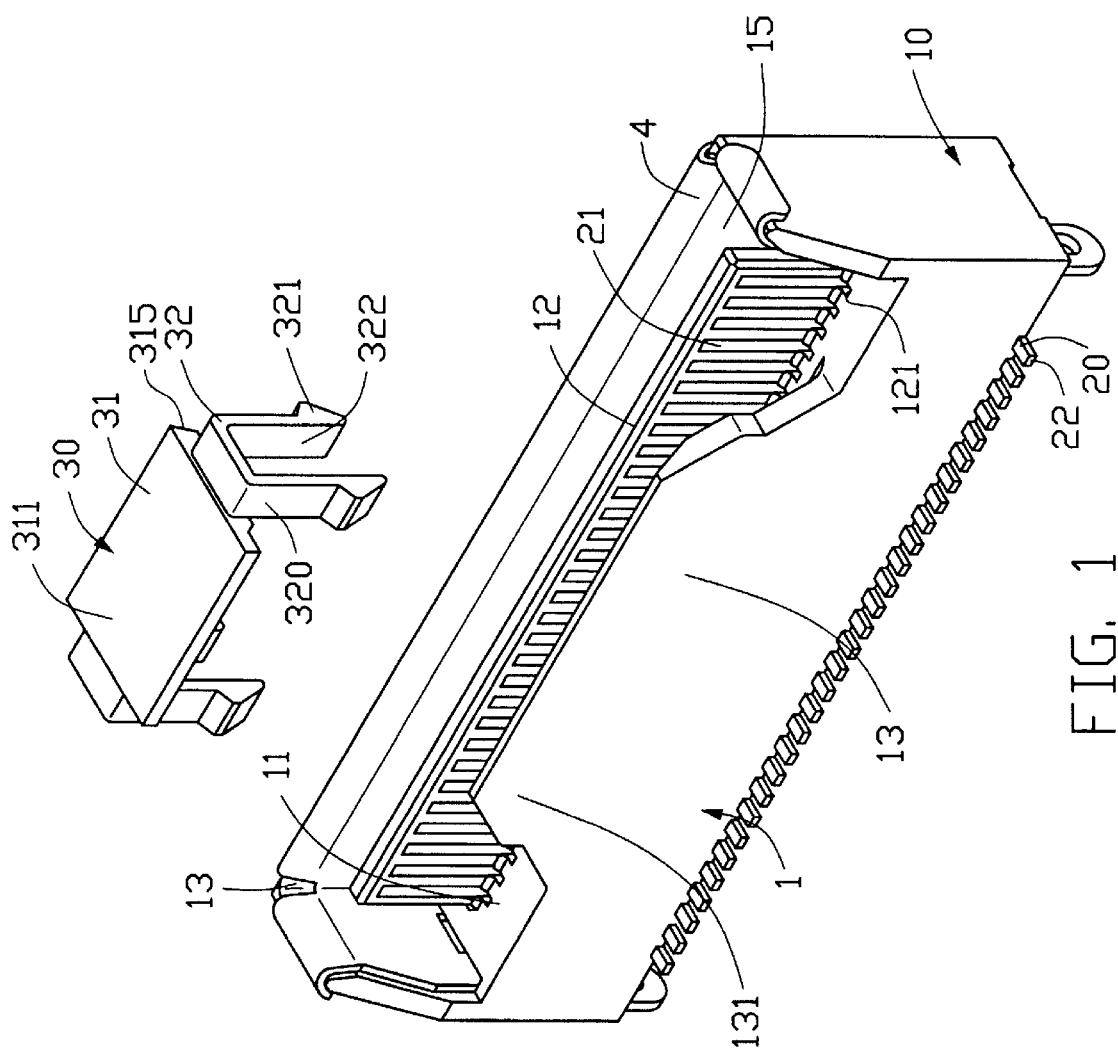
FIG. 1 is a partly exploded, perspective view of an electrical connector with a pick-up device in accordance with the present invention.
Figure 2:
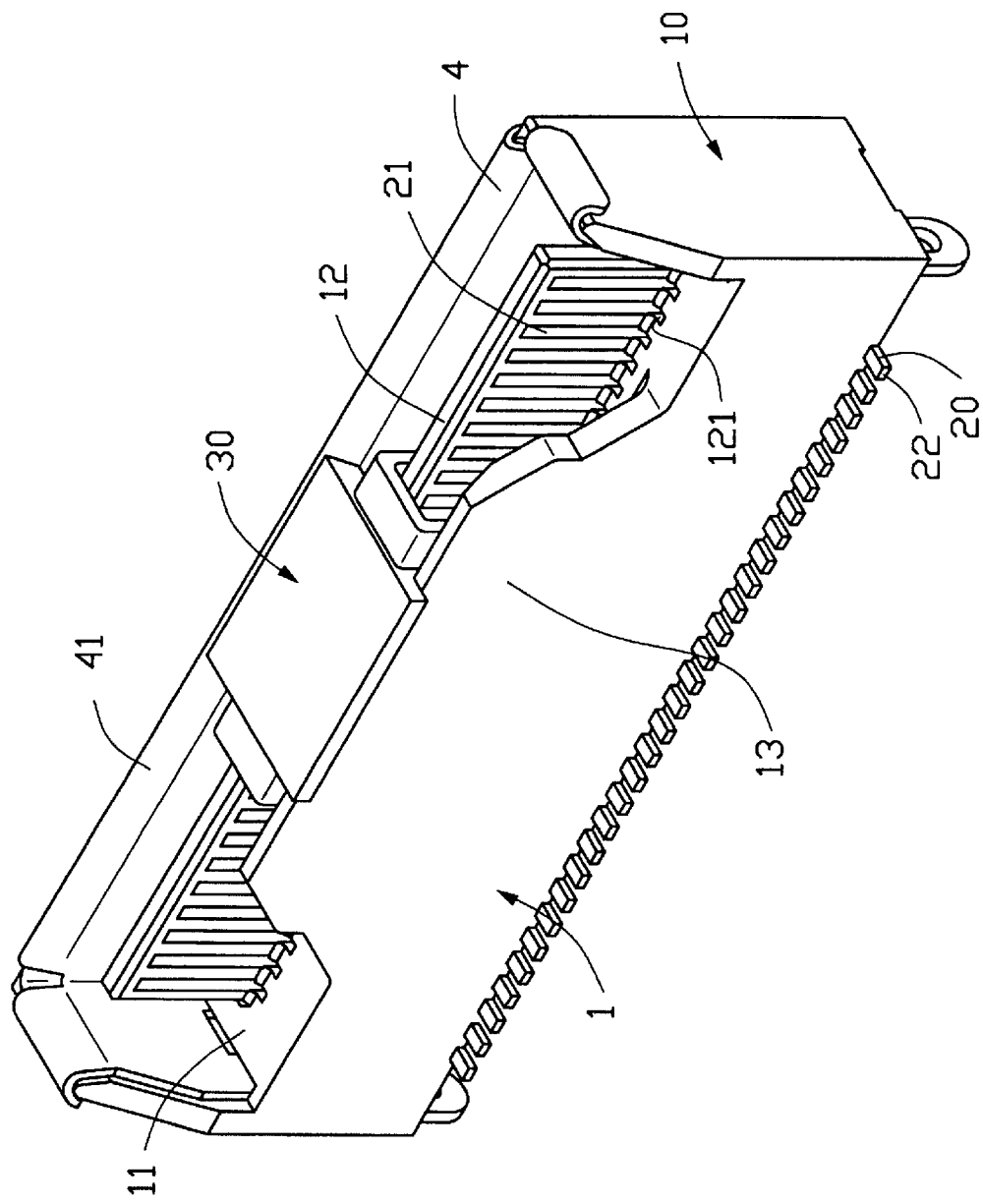
FIG. 2 is an assembled view of the electrical connector with the pick-up device shown in FIG. 1.
Figure 3:
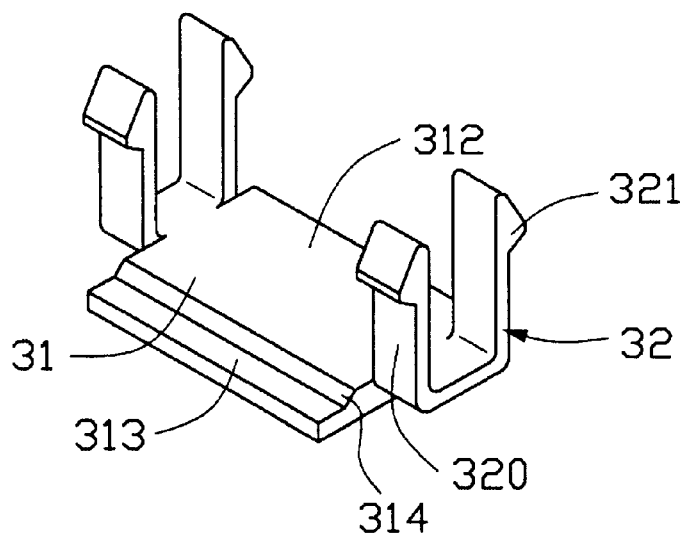
FIG. 3 is a bottom, perspective view of the pick-up device shown in FIG. 1.
Figure 4:
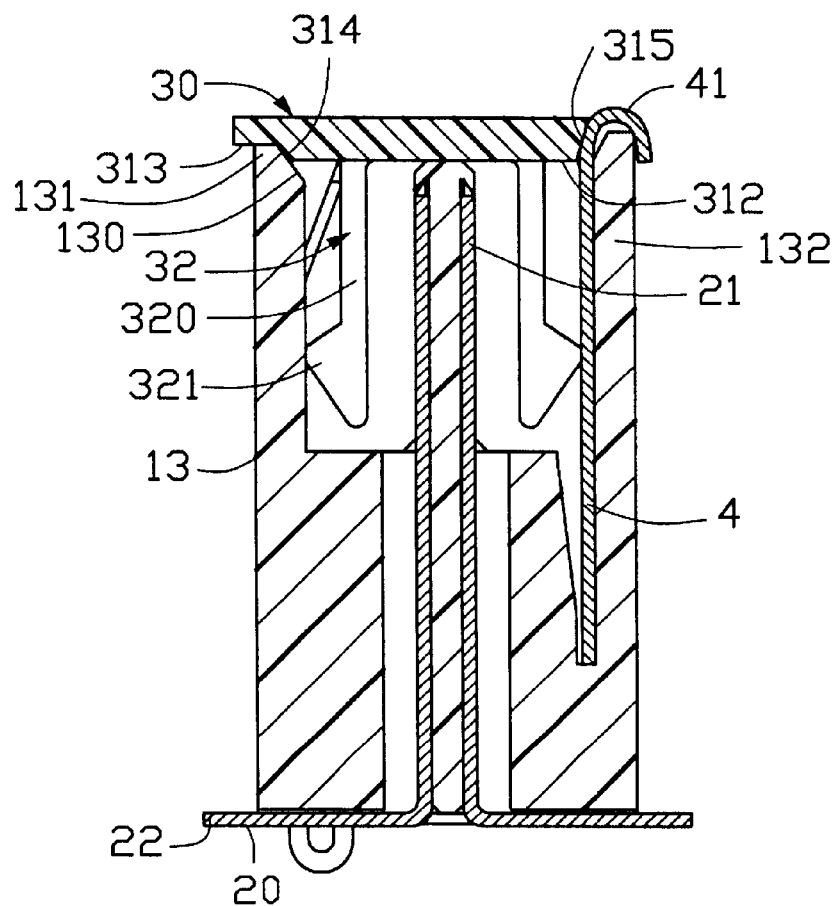
FIG. 4 is a cross-sectional view of the electrical connector with the pick-up device attached thereto.

Reference will now be made to the drawing figures to describe the present invention in detail.

Referring to FIGS. 1 through 4, a pick-up device 30 made of resilient insulating material in accordance with the present invention, attachable to an electrical connector 1, comprises a rectangular plate 31 and a pair of U-shaped retaining portions 32 extending from opposite transverse side edges of the rectangular plate 31. Each U-shaped retaining portion 32 comprises a pair of downwardly projecting legs 320, between which an engaging space 322 is defined. Retaining feet 321 are formed respectively on outer surfaces of the pair of legs 320 at lower ends and protrude in directions opposite to each other. The rectangular plate 31 has a flat, upper surface 311 for suction by a vacuum-suction nozzle and a lower surface 312 opposite to the upper surface 311. A longitudinally depressed area 313 is defined in the lower surface 312. Between the depressed area 313 and the lower surface 312, an inclined first face 314 is formed. Opposite to the first face 314, an inclined, second face 315 is formed on a longitudinal side of the plate 31.

As shown in FIG. 1, the electrical connector 1 includes an insulating housing 10, which has an elongated base wall 11 and four side walls 13 extending upwardly from respective edges of the base wall 11. The base wall 11 and the side walls 13 together define a mating cavity 15 therebetween for receiving a mating receptacle connector (not shown). A mating rib 12 projects upwardly from the base wall 11 and extends along a center line of the base wall 11. A plurality of passageways 121 are defined in opposite sides of the mating rib 12 and contacting portions 21 of conductive pins 20 of the electrical connector 1 are received therein for electrical connection to corresponding terminals of the mating receptacle connector. Opposite to the contacting portions 21 of the conductive pins 20 are soldering portions 22 which are bent and then extend outward from a bottom of the housing 10 for soldering to a circuit board (not shown). A longitudinal side wall 131 forms an inner inclined edge 130 at the top thereof for engaging with the first face 314 of the pick-up device 30.

The electrical connector 1 further includes a shielding plate 4, which encloses inner surfaces of the side walls 13 except for the longitudinal side wall 131, for shielding and grounding purposes. Top edges of the shielding plate 4 are bent to cover topsides of the other side walls 13, and form a smoothly curved surface 41.

In use, when the pick-up device 30 is inserted into the mating cavity 15 of the electrical connector 1, the retaining feet 321 of the pick-up device 30 abut against the inner surfaces of the longitudinal side wall 131 and the shielding plate 4 with the mating rib 12 being situated in the engaging space 322 of the pick-up device 30. The inclined first face 314 of the pick-up device 30 mates with the inclined edge 130 of the longitudinal side wall 131 and the second face 315 engages with the curved surface 41 of the shielding plate 4, thereby ensuring a precise positioning between the pick-up device 30 and the electrical connector 1. Thus, the soldering portions 22 of the conductive pins 20 could be soldered to the circuit board accurately.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly for being placed upon a surface of a circuit board by a vacuum-suction nozzle, comprising:

an insulating housing having an elongated base wall, opposite longitudinal and transverse side walls extending from the base wall, the base wall and the side walls together defining an upwardly exposed mating cavity therebetween, and a mating rib protruding from the base wall and extending parallel to the longitudinal side walls, the mating rib defining a plurality of passageways in opposite sides thereof;

a plurality of conductive pins received in the plurality of passageways; and a releasable pick-up device made of resilient insulating material, the pick-up device comprising a rectangular plate having a flat upper surface adapted for being suctioned by the vacuum-suction nozzle and an opposite lower surface, and a pair of retaining portions on opposite transverse sides of the rectangular plate, each retaining portion having a pair of downwardly projecting legs defining an engaging space therebetween for accommodating the mating rib, each pair of legs having a pair of respective retaining feet at free ends thereof extending away from each other, said pair of retaining feet abutting against inner sides of opposite longitudinal side walls, respectively; wherein the rectangular plate defines a longitudinal depressed area in the lower surface thereof and an inclined first face between the longitudinal depressed area and the lower surface; wherein the rectangular plate further defines an inclined second face on a longitudinal side opposite to the inclined first face; wherein one longitudinal side wall of the insulating housing has an inner inclined surface on a top side thereof engaged with the inclined first face of the pick-up device;

said assembly further comprising a shielding plate enclosing the opposite transverse side walls and the other longitudinal side wall, the shielding plate having top edges bent to cover top sides of the opposite transverse side walls and the other longitudinal side wall and forming an inner curved surface.

2. The electrical connector assembly as claimed in claim 1, wherein the inclined second face of the pick-up device engages with the curved surface of the shielding plate.

3. The electrical connector assembly as claimed in claim 2, wherein one of each pair of retaining feet abuts against an inner side of the shielding plate covering the other longitudinal side wall.

4. An electrical connector assembly comprising:

an insulative housing defining two opposite side walls, along a longitudinal direction thereof, and an upward mating cavity therebetween exposed to an exterior;

a plurality of conductive pins embedded within said mating cavity; and a releasable pick-up device including a plate with a pair of downwardly extending legs therefrom; wherein said pair of legs include retaining feet interferentially engaged wit at least one of interior surfaces of said two opposite side walls, and said plate covers at least a portion of said mating cavity with an edge of said plate defines a non-straight line configuration to comply with an upper edge of at least one of said two opposite side walls for positioning consideration along a transverse direction perpendicular to said longitudinal direction; wherein a mating rib is positioned between said two opposite side walls and also between said pair of legs; wherein a shielding plate is applied unto the other interior surface of said two opposite side walls, said shielding plate includes a curve around an upper edge thereof covering an upper edge of the other of said two opposite side walls, and said pick-up device defines a non-vertical line contour, at another edge opposite to said edge thereof, abutting against said curve.

5. The assembly as claimed in claim 4, wherein a lower portion of the plate is positioned in said mating cavity while an upper portion of the plate is positioned above said mating cavity.

6. The assembly as claimed in claim 4, wherein a mating rib of the housing is positioned between said two opposite side walls, which said plate is directly seated upon.

* * * * *